United States Patent [19]
McBride

[11] Patent Number: 5,854,093
[45] Date of Patent: Dec. 29, 1998

[54] DIRECT ATTACHMENT OF SILICON CHIP TO CIRCUIT CARRIER

[76] Inventor: Donald G. McBride, 2058 Cheshire Rd., Binghamton, N.Y. 13903

[21] Appl. No.: 976,685

[22] Filed: Nov. 24, 1997

Related U.S. Application Data

[62] Division of Ser. No. 531,814, Sep. 21, 1995.
[51] Int. Cl.$^6$ ............ H01L 21/44; H01L 21/48; H01L 21/50; H01L 21/302
[52] U.S. Cl. ............ 438/106; 438/118; 438/612; 438/691; 438/692; 438/693
[58] Field of Search .................... 438/106, 612, 438/691, 692, 693, 118

[56] References Cited

U.S. PATENT DOCUMENTS

| | | |
|---|---|---|
| 5,032,543 | 7/1991 | Black et al. . |
| 5,494,862 | 2/1996 | Kato et al. . |
| 5,503,698 | 4/1996 | Goldberg et al. . |
| 5,516,706 | 5/1996 | Kusakabe . |
| 5,622,875 | 4/1997 | Lawrence . |

OTHER PUBLICATIONS

"Three–Dimensional Discrete Wire Fan–Out Pattern", IBM Technical Disclosure Bulletin, vol. 27, No. 10A, Mar. 1985.

*Primary Examiner*—John F. Niebling
*Assistant Examiner*—Josetta I. Jones
*Attorney, Agent, or Firm*—Salzman & Levy

[57] ABSTRACT

The present invention features a method and an article of manufacture for directly attaching silicon chips to circuit carriers. Both the method and the article of manufacture feature a dissolvable, thin wafer that is soldered first to the chip and then to the circuit board, completing the connection. The wafer article consists of embedded, spaced-apart, flexible wires that fit the connection footprints of both the chip and the carrier board. The wafer is fashioned from a matrix block having a heat-resistant, dissolvable substance which encapsulates the wires. The matrix is cut into thin slices that are wafer-thin. Each slice or wafer of the matrix carrier is then attached to a chip, using solder with an appropriate melting temperature that is thermally compatible with the chip. The solder attaches one end of the embedded wires to the chip. The other end of the wafer's wires are then matched and soldered to the wire footprint of the circuit board, using another type of solder that melts at a temperature thermally compatible with the circuit board. Afterwards, the dissolvable, encapsulating material is removed from the body of the wafer, leaving the chip attached to the circuit carrier by only the remaining, interdisposed, flexible wires. In this way a "packageless" package or an "air/copper" package is fabricated.

5 Claims, 4 Drawing Sheets

DIRECT ATTACHMENT OF SILICON CHIP TO CIRCUIT CARRIER

This application is a division of application Ser. No. 08/531,814, filed Sep. 21, 1991.

FIELD OF THE INVENTION

The invention pertains to the attachment of silicon chips to a circuit board and, more particularly, to a method and article of manufacture for directly attaching a silicon chip to a circuit carrier. The article of manufacture comprises an intermediate wafer having wires that are encapsulated in a dissolvable matrix and are separately solder-bonded with thermally compatible solder to both the silicon chip and the circuit carrier. The possibility of connection breakage due to thermal stresses resulting from uneven expansion and contraction upon heating and cooling is, therefore, greatly reduced or eliminated.

BACKGROUND OF THE INVENTION

One of the major problems in the attachment of silicon chips to circuit boards is the unreliability of the solder connections, which presently use a bonding technique known as a "C4 connection". The term "C4 connection" is shorthand for "controlled collapse chip connection". The process utilizes solder balls at the connection terminals between the chip and the carrier substrate. These solder balls produce stiff, inflexible connections that often break. The cause of the breakage is often attributable to the mismatch of the thermal coefficient of expansion (TCE) between the chip material and the circuit board material. As the different materials heat and cool after soldering, they expand and contract at different rates. The non-uniform expansion and contraction creates great stress upon the connective solder joints with frequent subsequent breakage.

Another disadvantage of this technique is that, when melted, the solder often runs along the printed wires, thus shorting the circuit. Solder dams have been used to counteract this problem, but they are not always successful.

The C4 technique is becoming more problematical in the industry, because the density of the connections is increasing. The increasing connection density cannot be accommodated by the comparatively large solder balls, each of which is approximately 3–5 mil in diameter.

Other connection techniques have been proposed. It was recently suggested that wires can be encapsulated or potted within a support matrix, as proposed in IBM Technical Disclosure Bulletin, Vol. 27, No. 10A, published in March of 1985, and entitled "Three-Dimensional Discrete Wire Fan-Out Pattern". The matrix is used to connect a chip to a substrate. The wires within the matrix are intended to provide the flexibility that the solder balls cannot. Unfortunately, the proposed technique was never accomplished. It is believed that this method is impractical as proposed, due to the use of a double die, as well as the non-uniformity of the process, resulting from the multiple retwisting and repotting of the wires.

It is further believed that the aforementioned process cannot provide good connective integrity between the substrate and the chip. The fan-out pattern of wiring is, in all probability, impractical at this time; it is also problematical with respect to high-density connections. This fan-out connection pattern makes difficult, if not impossible, the proper high-density connectivity between the chip and the carrier substrate.

The present invention seeks to resolve the aforesaid connection problems by encapsulating insulated wires in a defined location within a temporary matrix carrier. The embedded wires extend substantially perpendicularly within the carrier. They have longer lengths than their diameters, so as to provide flexibility. The matrix is sliced into a number of very thin wafers. Each slice or wafer of the matrix carrier is then attached to a chip, using solder with an appropriate melting temperature that is compatible with the chip. The chip and slice combination are then matched and soldered to the wire footprint of the circuit board, using another type of solder that melts at a temperature compatible with the circuit board. Then the temporary encapsulating material is removed from the wafer, thus leaving the chip attached to the circuit carrier by only the remaining, interdisposed, flexible wires.

The temporary matrix material can comprise a water or organic solvent-dissolvable material, such as a water glass (sodium silicate), zinc chloride, eutectics, polysulfone, etc. The solder connections are achieved by a self-aligning solder joint technique that is reflowable (with the solder able to be melted and resolidified) and one that produces precise connections.

The wires have lengths that are longer than their diameters, in order to provide flexibility to the connection. The wires are usually insulated, and the insulation can be fabricated of materials that are not solder-wettable. The wires can also be chromium-plated, so that solder will not adhere thereto.

It is an object of this invention to provide an improved method for connecting silicon chips to circuit carriers.

It is another object of the invention to provide a method and an article of manufacture for directly connecting silicon chips to circuit boards in a flexible manner.

It is a further object of this invention to provide a method of connecting silicon chips to circuit carriers by a reflowable, self-aligning solder process that will not wet the wire connections between the silicon chip and the circuit board.

SUMMARY OF THE INVENTION

In accordance with the present invention, there are provided a method and an article of manufacture for directly attaching silicon chips to circuit carriers. Both the method and the article of manufacture feature a dissolvable, thin wafer that is soldered first to the chip and then to the circuit board, thus completing the connection therebetween. The wafer article further comprises embedded, spaced-apart, flexible wires that fit the connection footprints of both the chip and the carrier board. The wafer is fashioned from a matrix block comprising a heat-resistant, dissolvable substance which encapsulates the wires. The matrix is cut into thin slices that are wafer-thin. Each slice or wafer of the matrix carrier is then attached to a chip, using solder with an appropriate melting temperature that is thermally compatible therewith. The solder attaches one end of the embedded wires to the chip. The other end of the wafer's wires are then matched and soldered to the wire footprint of the circuit board, using another type of solder that also melts at a temperature that is thermally compatible therewith. Thereafter, the dissolvable, encapsulating material is removed from the body of the wafer, thus leaving the chip attached to the circuit carrier by only the remaining, interdisposed, flexible wires. In this way a "packageless" package or an "air/copper" package is fabricated. The wires have lengths that are longer than their diameters, in order to provide flexibility to the connection. The wires are usually insulated, with the insulation fabricated of materials that are not solder- wettable, such as polytetrafluoroethylene (PTFE). The wires can alternatively be chromium-plated, so that solder will not adhere thereto.

BRIEF DESCRIPTION OF THE DRAWINGS

A complete understanding of the present invention may be obtained by reference to the accompanying drawings, when considered in conjunction with the subsequent detailed description, in which.

For the sake of brevity and clarity, like elements and components will bear the same designations and numbering throughout the FIGURES.

DESCRIPTION OF THE PREFERRED EMBODIMENT

Generally speaking, the invention features both a unique method and an article of manufacture for attaching silicon chips to circuit boards. The connection is both flexible and solder non-wettable. The connections are precise and will not break due to heat stress. The article of the invention is designed to accommodate circuit boards having a high density of connections.

Figure 1:
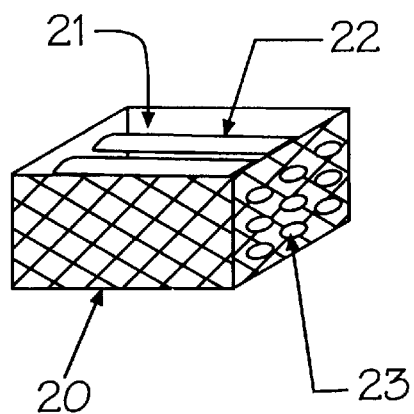
FIG. 1 depicts a perspective view of a fixture used to pot a matrix about a plurality of connecting wires.
Figure 1A:
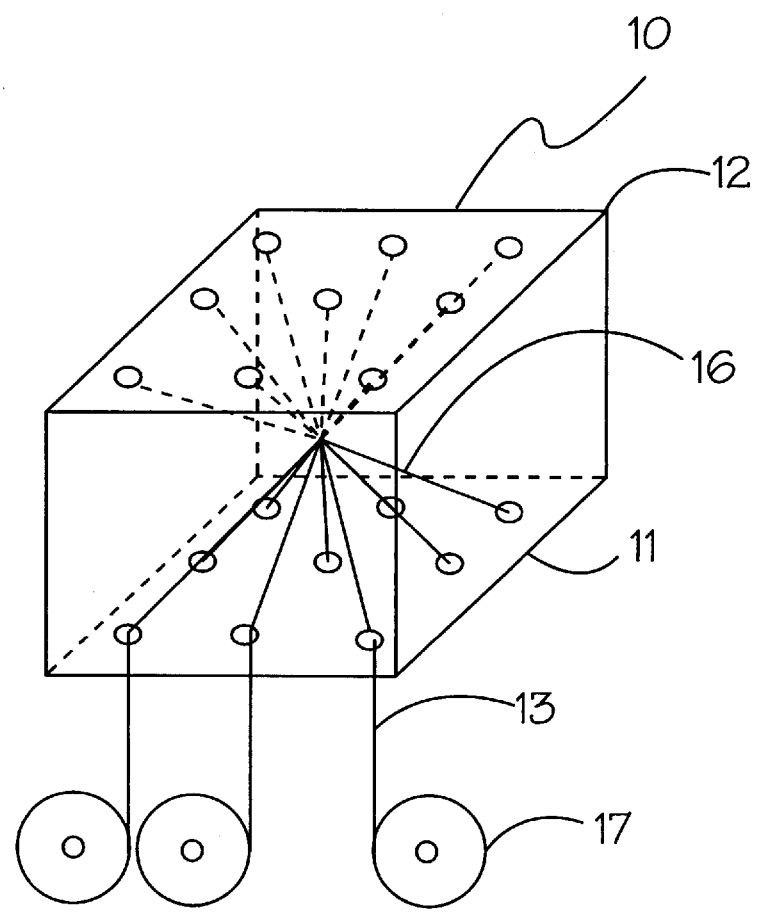
FIG. 1a illustrates a schematic, perspective view of a matrix of the prior art, containing embedded wires and intended for use in connecting a chip to a circuit board.

Now referring to the prior art, FIG. 1a, a pottable matrix 10, is shown. The matrix 10 is formed by potting about a plurality of crossed wires 16 that are supplied by wire spools 17. Upper and lower dies 12 and 11, respectively, are used to eliminate the need to restring the wires 13 in order to form a fan-out pattern. Connection between the chip and the substrate circuit board is made, using the common C4 connection. The matrix 10 usually requires multiple pottings and the wires 13 usually must be retwisted, in order to adjust the pattern. This particular matrix attachment method has never been implemented, which is undoubtedly a result of the improbability of having a mass-production process that requires so much adjustment (i.e., repotting and retwisting) in order to provide the proper alignment for connectivity. Also, it is probable that the stresses introduced in the wire twisting and C4 solder processes would produce at least one wire or connection that would break.

Figure 2:
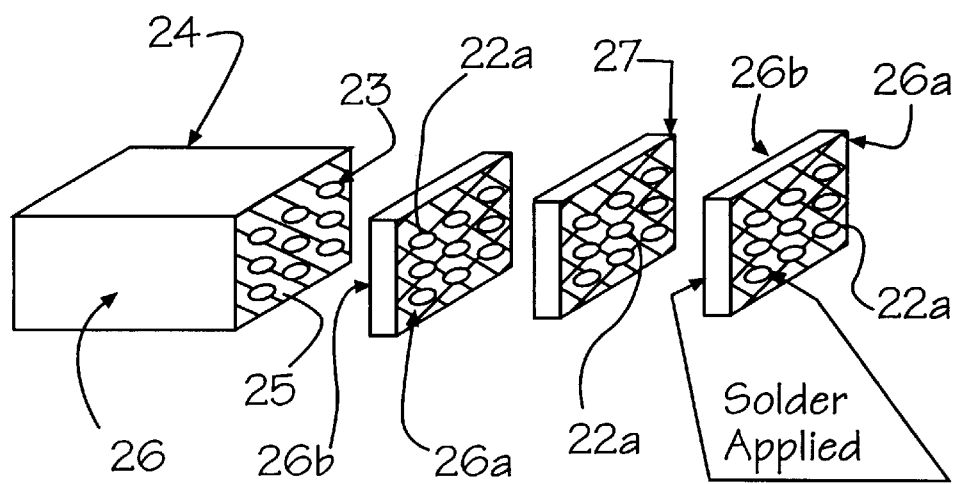
FIG. 2 shows a perspective view of a matrix block, having embedded wires therein, that was molded in the fixture illustrated in FIG. 1, and the subsequent slicing of the block into wafer articles.
Figure 4:
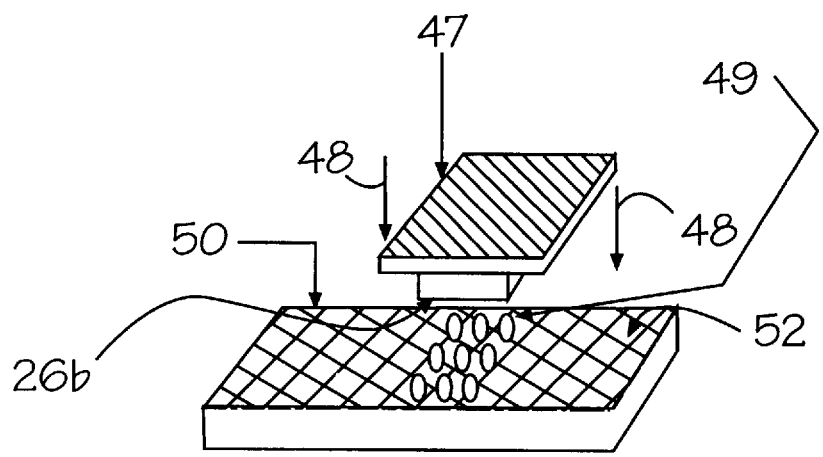
FIG. 4 illustrates the combination of the silicon chip and the wafer formed in FIG. 3, matched and bonded to the connection footprint disposed on a circuit board.
Figure 5:
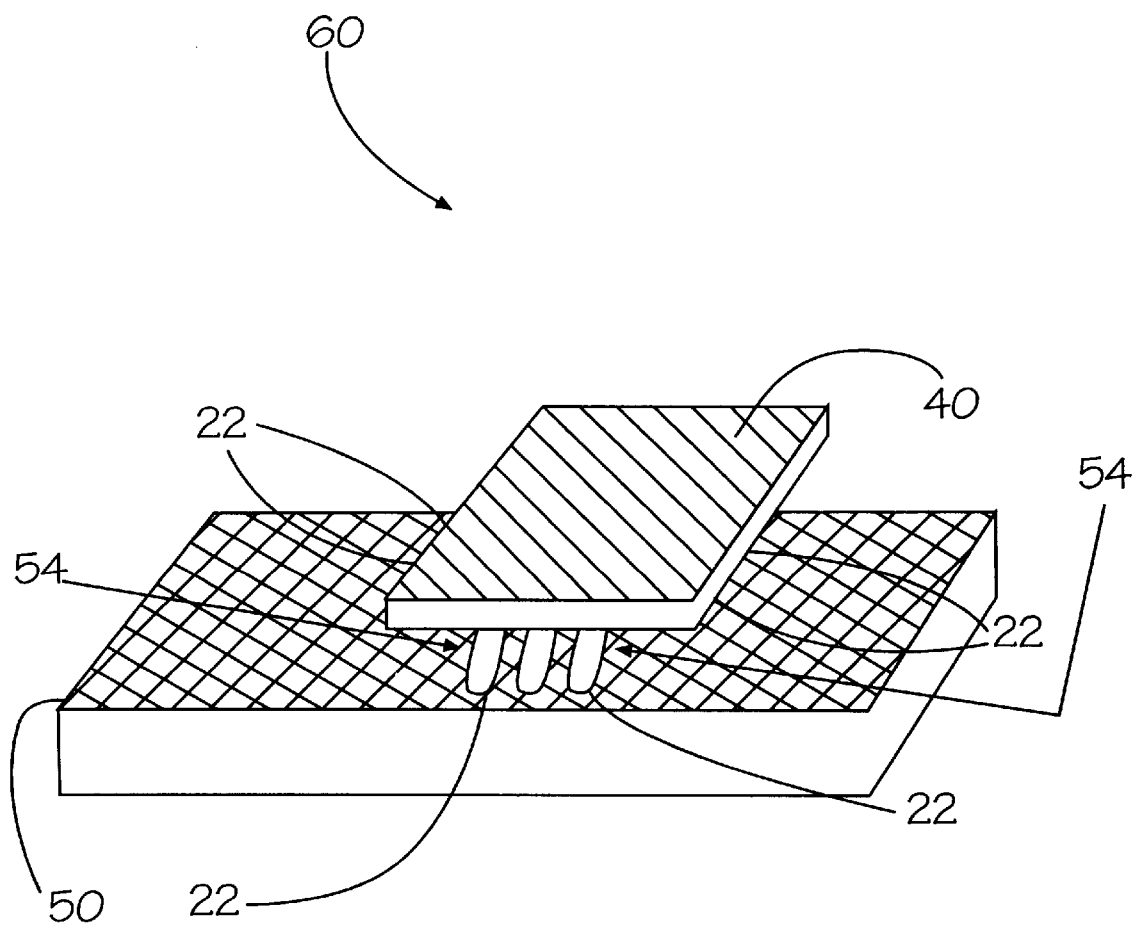
FIG. 5 shows the finalized connection of the silicon chip with the circuit board.

Referring now to FIGS. 1 and 2, a fixture mold 20 is shown for embedding wires 22 within a molded block 24, by filling the cavity 21 of the fixture mold 20 with a dissolvable material 25 that is water- or solvent-soluble, such as NaCl, sodium silicate (water glass), zinc chloride, suitable eutectics, etc. The wires 22 form a chip/board pattern 23 on the face 26 of the block 24, as shown. The chip/board pattern is the connection arrangement for the wires 22 when they are soldered to the chip 40 and circuit board 50 (as illustrated in FIGS. 4 and 5), respectively. The block 24 is cut into very thin slices to form wafers 27. The thickness of the wafer slice 27 is the length desired for the wires 22, which form the final connections between the chip and the circuit board. The wires 22 extend perpendicularly to the face 26 of the wafer 27. The length of wires 22 is greater than their diameter, thus providing a flexible connection between the chip 40 and the circuit board 50. Typical wire length-to-diameter ratios are 2:1 or greater. Typical wire lengths are in the range of between 10 to 20 mils.

Referring again to FIG. 2, the wafer slice 27 is cleaned and/or polished on its end faces 26a and 26b, respectively, in order to prepare the wires 22 for soldering. In order to make a more complete interconnection, the ends of the wires 22a optionally may be upraised by etching back the dissolvable material 25 using the appropriate solvent. After the respective faces 26a and 26b are polished, a layer of solder is applied thereto. Face 26a, that is to be connected to the chip 40, gets a thin solder layer of 95/5 Pb/Sn. The face 26b, that is to be connected to the circuit board 50, gets a thin solder layer of 90/10 Pb/Sn. These two different solders melt at different temperatures that are thermally compatible with the respective wafer 27, chip 40 and circuit board 50.

Figure 3:
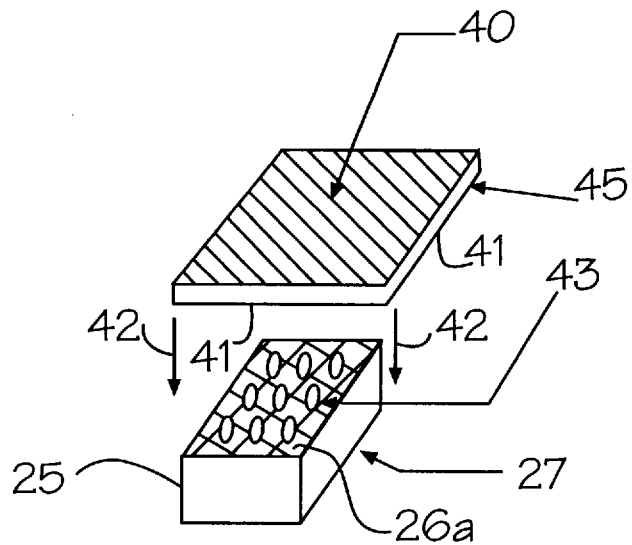
FIG. 3 depicts the attachment of the wafer article formed in FIG. 2 to a silicon chip.

Referring to FIG. 3, the silicon chip 40 is shown being connected (arrows 42) to the face 26a of the wafer 27. The underside 41 of chip 40 has metallized pads 45 that align with the soldered wires 43. The soldered wires 43 are attached to the metallized pads 45 by a reflow process. The chip 40 attached to the wafer 27 forms the slice-and-chip combination 47, shown in FIG. 4.

Referring to FIG. 4, the wafer slice-and-chip combination 47 is shown being connected (arrows 48) to the connection footprint 49 disposed on the surface 52 of the circuit board 50. The face 26b is matched with the footprint 49, and the solder is reflowed (melted and resolidified).

Referring to FIG. 5, the final product 60 is shown, comprising the chip 40 connected to the circuit board 50 by wires 22. The body of wafer slice 27 has been removed (arrows 54) by dissolving the embodied material in an aqueous or organic solvent, depending upon the material being utilized. The chip 40 and circuit board 50 are connected only by the remaining wires 22, which form flexible connections therebetween. The body of the wires 22 may contain an outer jacket of insulation. The insulation may be solder non-wettable, so as to prevent any possibility of short-circuiting during the solder attachment process. The body of the wires may alternatively be chromium-plated, to prevent solder adherence. The wires may be made of copper or gold, and they may be coaxial, metallic or conductive fiber. Conductive fiber wires can provide exceptional strength and flexibility, where these characteristics are needed in special applications.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of connecting a chip to a substrate, comprising the steps of:

a) molding a block of dissolvable material about a plurality of wires to embed the wires therein with a connection pattern;

b) slicing said block into wafers, each having a chip connection face and a substrate connection face;

c) attaching said chip connection face of said wafer to a chip, using a first solder that is thermally compatible with said chip;

d) attaching said substrate connection face of said wafer to said substrate, using a second solder that is thermally compatible with said substrate; and e) dissolving said dissolvable material to form a chip-and-substrate connection with said plurality of wires.

2. The method in accordance with claim 1, further comprising the step of:

f) preparing said chip connection face and said substrate connection face prior to respective attachment steps (c) and (d).

3. The method in accordance with claim 2, wherein said preparation step (f) further comprises the step of:

g) polishing said chip connection face and said substrate connection face.

4. The method in accordance with claim 2, wherein said preparation step (f) further comprises the step of:

g) applying said first solder to said chip connection face and said second solder to said substrate connection face.

5. The method in accordance with claim 3, wherein said polishing step (g) is followed by the step of:

h) applying said first solder to said chip connection face and said second solder to said substrate connection face.

* * * * *